(12) United States Patent
Kitajima

(10) Patent No.: US 8,975,710 B2
(45) Date of Patent: Mar. 10, 2015

(54) SEMICONDUCTOR DEVICE HAVING A THICK GATE INSULATING FILM COVERING BIRD'S BEAK REGION

(71) Applicant: Seiko Instruments Inc., Chiba (JP)

(72) Inventor: Yuichiro Kitajima, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/966,476

(22) Filed: Aug. 14, 2013

(65) Prior Publication Data

US 2013/0328128 A1 Dec. 12, 2013

Related U.S. Application Data

(62) Division of application No. 12/887,846, filed on Sep. 22, 2010, now Pat. No. 8,541,279.

(30) Foreign Application Priority Data

Sep. 24, 2009 (JP) ................................. 2009-219781

(51) Int. Cl.
*H01L 27/088* (2006.01)
*H01L 21/8234* (2006.01)

(52) U.S. Cl.
CPC ...... *H01L 27/088* (2013.01); *H01L 21/823462* (2013.01)
USPC .................................... 257/392; 257/E27.06

(58) Field of Classification Search
USPC ............................................. 257/392, E27.06
See application file for complete search history.

(56) References Cited

U.S. PATENT DOCUMENTS

| | | | | |
|---|---|---|---|---|
| 4,591,890 A | * | 5/1986 | Lund et al. | 257/398 |
| 5,327,000 A | * | 7/1994 | Miyata et al. | 257/344 |
| 5,430,316 A | | 7/1995 | Contiero et al. | |
| 6,037,201 A | * | 3/2000 | Tsai et al. | 438/197 |
| 6,306,709 B1 | | 10/2001 | Miyagi et al. | |
| 7,396,715 B2 | | 7/2008 | Ikeda | |
| 2005/0167761 A1 | * | 8/2005 | Watanabe | 257/392 |
| 2008/0006879 A1 | * | 1/2008 | Harada et al. | 257/368 |

FOREIGN PATENT DOCUMENTS

| | | |
|---|---|---|
| JP | 58-100450 A | 6/1983 |
| JP | 01-110761 A | 4/1989 |
| JP | 03-231456 A | 10/1991 |

* cited by examiner

*Primary Examiner* — Robert Huber
(74) *Attorney, Agent, or Firm* — Brinks Gilson & Lione

(57) ABSTRACT

By covering ends of a field insulating film in a region where a MOS transistor having a relatively thin gate insulating film is formed with a relatively thick gate insulating film, a channel region of the MOS transistor having the relatively thin gate insulating film is set apart from an inversion-preventing diffusion layer formed under the field insulating film so as not to be influenced by film thickness fluctuation of the field insulating film, etching fluctuation of the relatively thick gate insulating film, and impurity concentration fluctuation at both sides of the channel due to the inversion-preventing diffusion layer.

4 Claims, 4 Drawing Sheets

SEMICONDUCTOR DEVICE HAVING A THICK GATE INSULATING FILM COVERING BIRD'S BEAK REGION

RELATED APPLICATIONS

This application is a divisional patent application of U.S. patent application Ser. No. 12/887,846, filed Sep. 22, 2010, which claims priority under 35 U.S.C. §119 to Japanese Patent Application No. 2009-219781 filed on Sep. 24, 2009, the entire contents of which are hereby incorporated by reference.

BACKGROUND OF THE INVENTION

1. Field of the Invention

The present invention relates to a semiconductor device and a manufacturing method therefor in which a metal oxide semiconductor (MOS) transistor having a relatively thick gate insulating film and a MOS transistor having a relatively thin gate insulating film are formed simultaneously.

2. Description of the Related Art

In recent years, a large variety of mobile devices have been widely distributed, and lithium ion batteries, which have high energy density and no memory effect, are widely used as a power source for them. Accordingly, there is also a demand for protection ICs for detecting overcharging and over-discharging of the lithium ion batteries. For example, in the lithium ion batteries of mobile phones, a battery voltage is about 3.6 V. However, a voltage equal to or higher than 20 V is applied during charging, and hence the ICs are required to include elements having high withstanding voltage.

In this case, when the above-mentioned IC specification is supposed to be satisfied through a CMOS transistor manufacturing process, a MOS transistor suitable for a low withstanding voltage and a MOS transistor suitable for a high withstanding voltage should be formed. The reason is as follows. The size of a high withstanding voltage element needs to be formed relatively large so as to satisfy the specification, and when the entire IC is formed using only the high withstanding voltage elements, the final chip size increases, making the IC weak in cost competitiveness, and making it difficult to satisfy demands for price from the market. Accordingly, the chip size should be suppressed by using high withstanding voltage elements in a circuit portion to which high voltage is applied and by using low withstanding voltage elements in other circuit regions.

For the reason described above, a semiconductor device in which gate oxide films are formed to have different thicknesses appropriate for obtaining high withstanding voltage and low withstanding voltage, respectively, and a manufacturing method therefor are essential.

Hereinafter, a conventional manufacturing method for a semiconductor device having gate oxide films of different thicknesses is described. FIGS. 4A to 4E illustrate steps of a manufacturing flow of the conventional semiconductor device. First, as illustrated in FIG. 4A, field insulating films 23 are formed on a semiconductor substrate 52 in an element separation region by a so-called LOCOS method. Under the field insulating films 23, inversion-preventing diffusion layers 31 are formed. The diffusion layers are formed by, for example, an ion implantation method, using a nitride film deposited for formation of the field insulating films 23 as a mask.

Next, as illustrated in FIG. 4B, a first gate insulating film 24 being relatively thick is formed by thermal oxidation. After that, as illustrated in FIG. 4C, a photo resist 41 is formed in a region where a high withstanding voltage element is formed by a photolithography method. Then, using the photo resist 41 as a mask, the first gate insulating film 24 in a region where a low withstanding voltage element is formed is etched to be removed.

Next, a second gate oxide film 25 being relatively thin is formed by thermal oxidation, to thereby obtain a structure illustrated in FIG. 4D. Then, as illustrated in FIG. 4E, gate electrodes 51 are formed of, for example, a polycrystalline silicon film. In this manner, it is possible to obtain a MOS structure having different gate oxide film thickness on the semiconductor substrate 52 (for example, see JP 58-100450 A, JP 01-110761 A, and JP 03-231456 A).

In the conventional manufacturing method for a semiconductor device as described above, the first gate insulating film 24 should be unfailingly removed in the region where the low withstanding voltage element is formed. Further, considering the process fluctuation of the thickness of the first gate insulating film 24, over etching should be performed. In this case, in the region where the low withstanding voltage element is formed, a thinning region of the field insulating film 23 formed by the LOCOS method, that is, a region called "bird's beak", may also be etched, resulting in exposure of the surface of the semiconductor substrate 52 with a hollow.

As a result, the size of the region where the low withstanding voltage element is formed varies depending on the bird's beak length of the field insulating film 23 and the etching fluctuation of the first gate oxide film 24. In other words, a width of the MOS transistor easily varies, and hence fluctuation of the characteristic of the MOS transistor is easily generated in this structure. Further, as a result, the inversion-preventing diffusion layer 31 formed under the field insulating film 23 comes into existence in the region where the low withstanding voltage element is formed. Due to influences of the above, a so-called narrow-channel effect, in which a threshold voltage undesirably increases when a channel width of the MOS transistor is designed to be short, easily appears. Further, since the degree of the narrow-channel effect significantly varies due to fluctuation of the channel width, the MOS transistor might be manufactured by a manufacturing method with low controllability.

Further, a crystal structure of the semiconductor substrate surface at the bird's beak portion, where the first gate insulating film 24 is etched, is considered to be distorted due to a stress generated by the presence of nitride film during the formation of the field insulating film by the LOCOS method. Then there is a possibility that the second gate insulating film 25 having low quality is formed, and there remains concern for reliability of the gate insulating film.

As described above, in the conventional manufacturing method for a semiconductor device, there is a problem in that the element size is required to be set large so as to reduce the element characteristic fluctuations, which unfavorably leads to increase in chip size. Further, there is a problem in that a fear in terms of gate insulating film reliability still remains even if the element size is increased.

SUMMARY OF THE INVENTION

In order to solve the above-mentioned problems, the present invention uses the following means.

(1) A semiconductor device includes a MOS transistor having a relatively thick gate insulating film and a MOS transistor having a relatively thin gate insulating film, both of which are formed simultaneously, wherein the MOS transistor having the relatively thin gate insulating film has a channel region which is set apart from a bird's beak region of a field insulating film by covering an end of the field insulating film in a region of the MOS transistor having the relatively thin gate insulating film with the relatively thick gate insulating film.

(2) In the semiconductor device according to item (1), the MOS transistor having the relatively thick insulating oxide film has a structure in which high concentration diffusion layers serving as a source and a drain are set apart by the field insulating film.

(3) A manufacturing method for a semiconductor device includes:
- forming a pad oxide film on a semiconductor substrate of a first conductivity type;
- forming a nitride film on the pad oxide film;
- etching only a predetermined region of the nitride film using a pattern of a photo resist;
- forming an inversion-preventing diffusion layer of the first conductivity type and an offset diffusion layer of a second conductivity type by performing ion implantation into an opening region formed in the nitride film;
- forming a field insulating film in the opening region where the nitride film is etched;
- removing the nitride film and the pad oxide film;
- forming a relatively thick gate insulating film on a surface of the semiconductor substrate;
- removing only a desired region of the relatively thick gate insulating film using a pattern of a photo resist;
- forming a relatively thin gate insulating film;
- forming a polycrystalline silicon film;
- imparting electrical conductivity to the polycrystalline silicon film;
- etching only a desired region of the polycrystalline silicon film using a pattern of a photo resist; and
- forming a high concentration diffusion layer of the second conductivity type by performing ion implantation into only a desired region using the pattern of the photo resist.

(4) In the manufacturing method for a semiconductor device according to item (3), the forming the relatively thick gate insulating film is performed prior to the forming the relatively thin gate insulating film.

(5) In the manufacturing method for a semiconductor device according to item (3), in the removing only a desired region of the relatively thick gate insulating film using a pattern of a photo resist, the relatively thick gate insulating film existing on an end of the field insulating film, corresponding to a bird's beak portion, in a region where the MOS transistor having the relatively thin gate insulating film is formed is prevented from being removed.

(6) In the manufacturing method for a semiconductor device according to item (3), in the removing only a desired region of the relatively thick gate insulating film using a pattern of a photo resist, the pattern of the photo resist is formed so that a region which becomes a high concentration diffusion layer of the MOS transistor having the relatively thick gate insulating film is opened.

(7) In the manufacturing method for a semiconductor device according to item (3), in the forming a high concentration diffusion layer of the second conductivity type by performing ion implantation into only a desired region using a pattern of a photo resist, the ion implantation is performed with implantation energy set so as to prevent the impurities from passing through the relatively thick gate insulating film.

By covering ends of the field insulating film in the region where the MOS transistor having the relatively thin gate insulating film is formed with the relatively thick gate insulating film, the channel region of the MOS transistor having the relatively thin gate insulating film is set apart from the inversion-preventing diffusion layer formed under the field insulating film. Accordingly, the MOS transistor is not influenced by the film thickness fluctuation of the field insulating film, the etching fluctuation of the first gate insulating film, which is relatively thick, and the impurity concentration fluctuation at both sides of the channel due to the inversion-preventing diffusion layer. Further, it is possible to suppress influence of narrow-channel effect generated when the channel width of the MOS transistor is designed to be short. Accordingly, it is possible to provide a semiconductor device having a stable element characteristic.

DETAILED DESCRIPTION OF THE PREFERRED EMBODIMENT

Hereinafter, a semiconductor device and a manufacturing method therefor according to the present invention are described in detail with reference to the drawings.

Figure 1A:
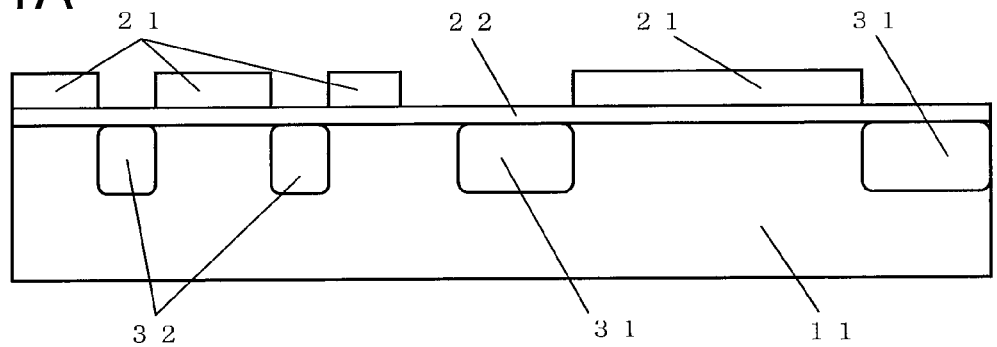
FIGS. 1A to 1D are schematic cross-sectional views illustrating steps in a flow of a manufacturing method for a semiconductor device according to an embodiment of the present invention.
Figure 1B:
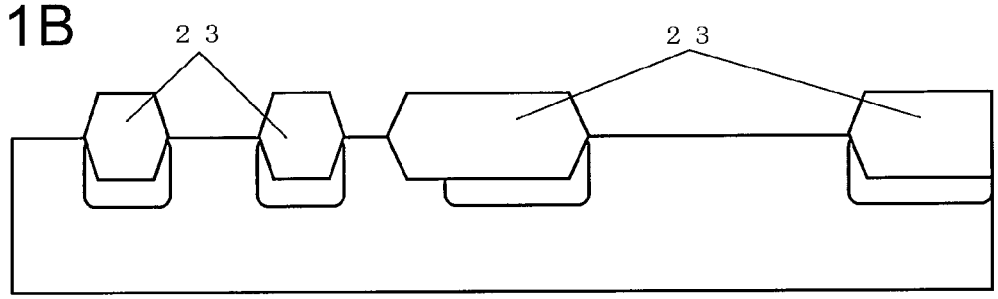

FIGS. 1A to 1D and FIGS. 2A to 2C illustrate the manufacturing method for a semiconductor device according to an embodiment of the present invention. Note that, in the following description, a case where an N-channel type metal oxide semiconductor (MOS) transistor is used is described by way of example. A state illustrated in FIG. 1A is obtained by the following steps. A pad oxide film 22 is formed on a P-type semiconductor substrate 11. Next, a nitride film 21 is formed on the pad oxide film 22, and then the nitride film 21 is patterned to open desired regions. After that, an inversion-preventing diffusion layer 31 and an offset diffusion layer 32 are formed by performing ion implantation into surface regions of the P-type semiconductor substrate 11 in the regions where the opening has been performed. Note that, the patterning of the nitride film 22 is performed by dry etching with, for example, a fluorine-based gas, using a photo resist patterned by a photolithography method as a mask. Then, boron, for example, which has the same conductivity type as the semiconductor substrate is introduced by ion implantation in an element separation region, and phosphorus, for example, which has the opposite conductivity type to the semiconductor substrate is introduced by ion implantation in a region which becomes a drain/source offset region of a MOS transistor, to thereby form the inversion-preventing diffusion layer 31 and the offset diffusion layer 32, respectively. Impurities are selectively introduced into the regions, using the resist patterned by the photolithography method as a mask.

Next, using the nitride film 21 as a mask, thermal oxidation treatment is performed in, for example, a wet oxygen atmosphere. In this manner, a field insulating film 23 with a thickness of 600 nm to 800 nm is formed on the surface of the semiconductor substrate in regions not covered with the nitride film 21. After that, the nitride film 21 and the pad oxide film 22 are removed, to thereby obtain a state illustrated in FIG. 1B.

Figure 1C:
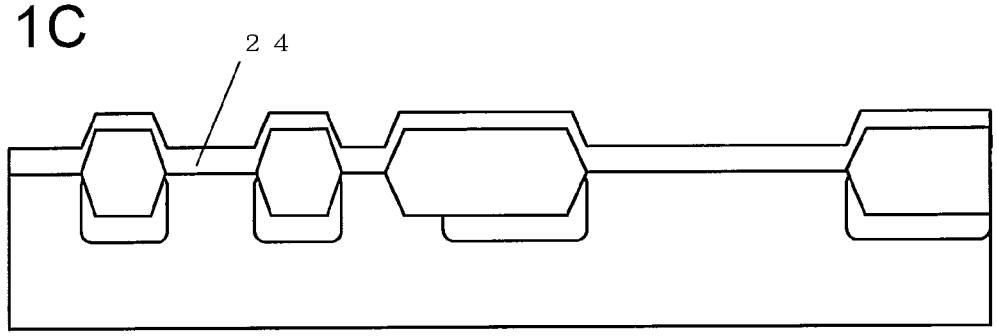

Next, as illustrated in FIG. 1C, a first gate insulating film 24 being relatively thick is formed by thermal oxidation in, for example, a wet oxygen atmosphere. In this case, a thickness of the first gate insulating film is set so that, when impurity ion implantation is performed to form high concentration diffusion layers which become a source and a drain, the impurities are not introduced into the P-type semiconductor substrate 11, that is, the impurities with which the ion implantation is performed do not pass through the first gate insulating film 24. However, on the other hand, the thickness of the first gate insulating film is set as thin as possible within such a range as to prevent breakdown of the MOS transistor having the relatively thick gate insulating film even when a maximum applicable voltage required in a high withstanding voltage element is applied for a long time period, or a range in which an operation is not below standard with respect to a product specification in the form of the final product. In other words, the thickness is ultimately determined by considering balance of both conditions described above.

Figure 1D:
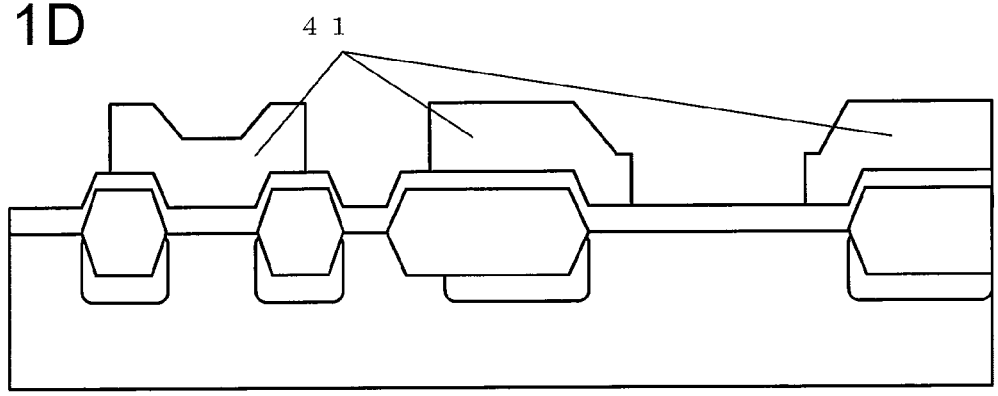

Next, a photo resist 41 is formed, and then patterned by a photolithography method as illustrated in FIG. 1D. The photo resist 41 is used as a mask for etching the first gate insulating film 24 being relatively thick. The photo resist 41 is patterned so that a region where a MOS transistor having a relatively thin gate insulating film is formed is opened. Note that, the pattern is formed so that bird's beak regions of the field insulating film 23 existing at ends of the region where a MOS transistor having a relatively thin gate insulating film is formed are covered with the photo resist 41.

Further, a width of the photo resist 41 covering the bird's beak of the field insulating film 23 is set so that the bird's beak region is not exposed, while considering a misalignment of the photo resist 41 and an etching amount in the lateral direction when the first gate insulating film 24 being thick is etched. In addition, the photo resist 41 is patterned so that high concentration diffusion layer formation regions which become a source and a drain of the MOS transistor having the relatively thick gate insulating film are opened. If the high concentration diffusion layer formation regions are not opened at this time, the first gate insulating film 24 being thick remains thereon. Accordingly, the high concentration diffusion layers of the MOS transistor having the thick gate insulating film may not be formed unless the remaining insulating film is removed in another step or a step of introducing impurities by ion implantation is added. This leads to an increase of the number of manufacturing steps. In order to decrease the number of manufacturing steps, the first gate insulating film 24 in the high concentration diffusion layer formation regions should thus be removed in this step.

Further, in this case, when the MOS transistor having the relatively thick gate insulating film is not based on a structure using a drain/source offset region by the field insulating film, the photo resist should only be formed on a region where a polycrystalline silicon film, which becomes a gate electrode, is formed so that the thick gate insulating film remains. However, in the case of the structure as described above, when wet etching is performed to etch the thick first gate insulating film 24, sides of the thick first gate insulating film 24 may also be etched due to isotropy, to thereby generate so-called "voids". Even if anisotropic dry etching is performed, there is a problem of a misalignment between the polycrystalline silicon film which becomes the gate electrode and the thick first gate insulating film 24, and hence forming a stable element may be extremely difficult. Accordingly, the structure of the MOS transistor having the relatively thick gate insulating film should apply the LOCOS offset MOS transistor having the offset region by the field insulating film 23, so as to separate the channel formation region and the high concentration diffusion layer regions in which the source and the drain are formed, to thereby avoid the problems described above.

Figure 2A:
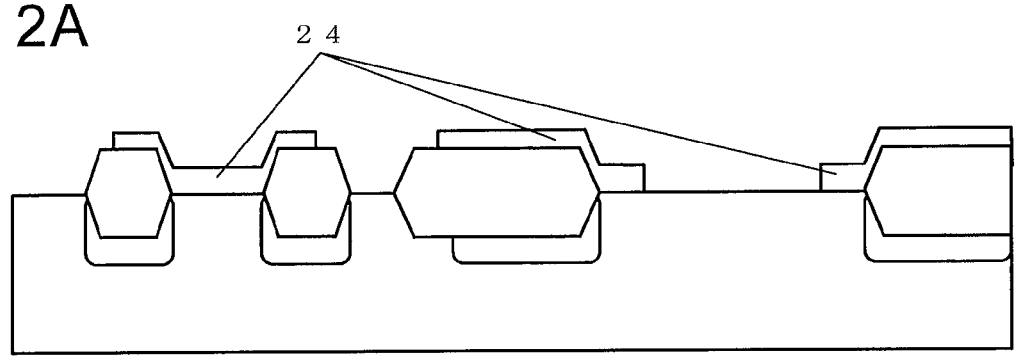
FIGS. 2A to 2C are schematic cross-sectional views illustrating steps in the flow of the manufacturing method for a semiconductor device according to the embodiment of the present invention.

Next, using the photo resist 41 as a mask, the first gate insulating film 24 is etched, to thereby obtain a state illustrated in FIG. 2A.

Figure 2B:
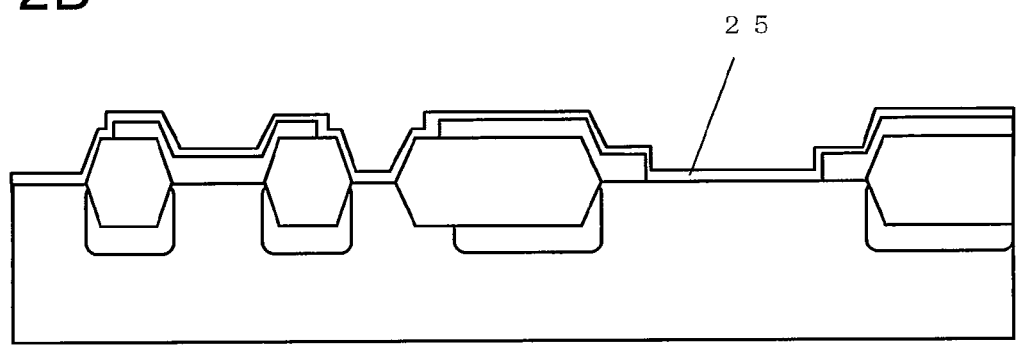
Figure 2C:
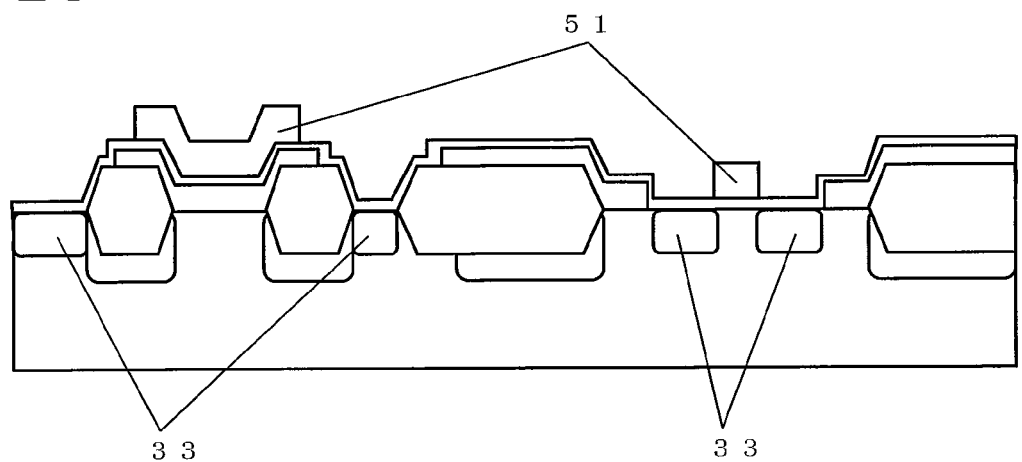

Next, as illustrated in FIG. 2B, a second gate insulating film 25 being relatively thin is formed by thermal oxidation in, for example, a wet oxygen atmosphere. A thickness of the second gate insulating film is set as thin as possible within such a range as to prevent breakdown of the MOS transistor having the relatively thin gate insulating film even when a maximum applicable voltage required in a low withstanding voltage element is applied for a long time period, or a range in which an operation is not below standard with respect to a product specification in the form of the final product. In other words, the thickness is ultimately determined by considering balance of both conditions described above.

Next, over the second gate insulating film 25, a polycrystalline silicon film having a thickness of 200 nm to 400 nm is formed by, for example, a chemical vapor deposition method. Then, for example, phosphorus is diffused into the polycrystalline silicon film at an impurity concentration of about $1 \times 10^{20}$ atom/cm$^3$ by a solid phase diffusion method, to thereby impart electrical conductivity thereto. At this time, the impurities may be implanted into the polycrystalline silicon film not by the solid phase diffusion method but by ion implantation. After that, the polycrystalline silicon film having electrical conductivity is patterned, to thereby form gate electrodes 51 at desired positions.

Next, using the patterned gate electrodes 51 as a mask, for example, arsenic may be introduced by the ion implantation method. In this manner, high concentration diffusion layers 33 serving as the source and the drain are formed, to thereby obtain a structure illustrated in FIG. 2C. In this case, ion implantation energy is set so that the impurities used in ion implantation are prevented from passing through the first gate insulating film 24 being relatively thick, but allowed to pass through the second gate insulating film being relatively thin. In other words, using the first gate insulating film 24 being relatively thick as a mask, the impurities are introduced into the semiconductor substrate 11 in a self-aligned manner. Here, as an energy condition of ion implantation, energy capable of forming the high concentration diffusion layers 33 in a stable manner is set, while considering thickness fluctuation of the second gate insulating film 25 existing on a surface above the P-type semiconductor substrate 11 in the region into which the impurities are introduced and range fluctuation during ion implantation. In this regard, determination of the thickness of the first gate insulating film 24 is made considering ion implantation energy set as described above.

Figure 3A:
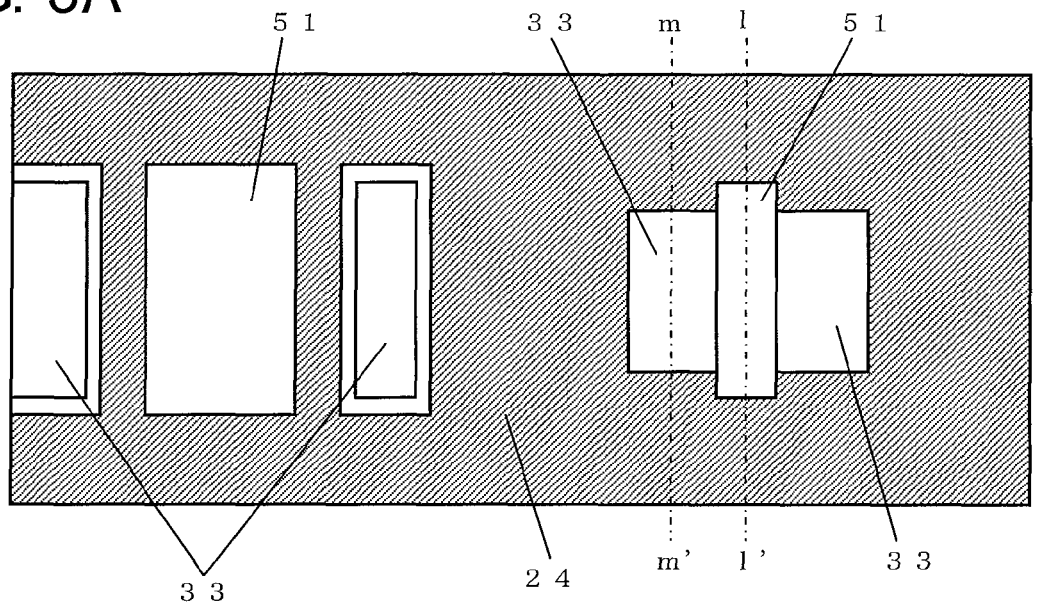
FIG. 3A is a schematic plan view and FIGS. 3B and 3C are schematic cross-sectional views of a semiconductor device according to the embodiment of the present invention.

Next, effects of the present invention are described with reference to the drawings. FIG. 3A is a plan view of the cross-section structure illustrated in FIG. 2C. Further, FIG. 3B is a cross-sectional view taken along the dashed-dotted line 1-1' of FIG. 3A, and FIG. 3C is a cross-sectional view taken along the dashed-dotted line m-m' of FIG. 3A.

Figure 3B:
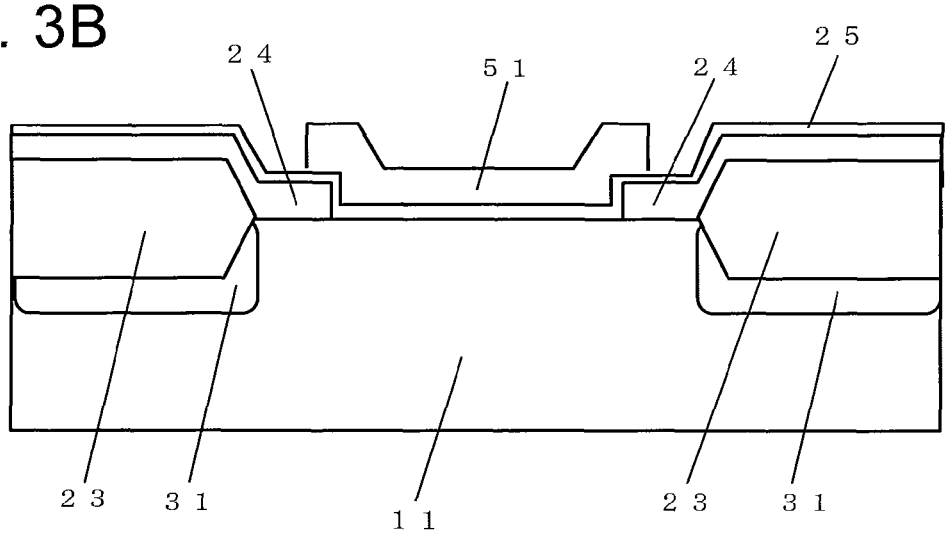
Figure 3C:
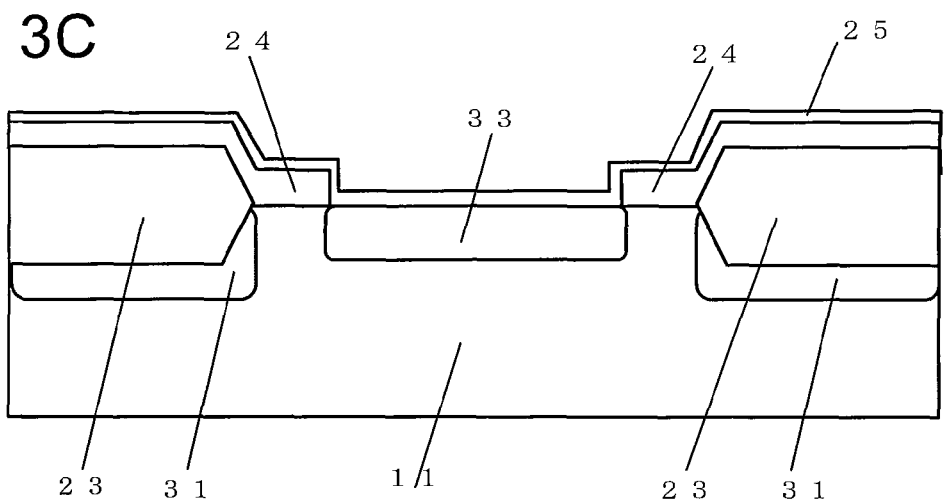
Figure 4A:
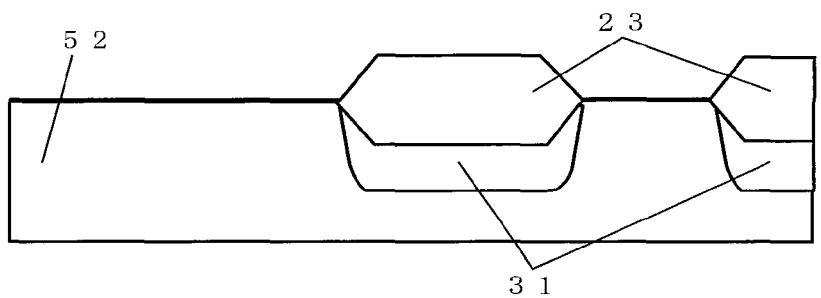
FIGS. 4A to 4E are schematic cross-sectional views illustrating steps a flow of a manufacturing method for a semiconductor device according to a conventional example.
Figure 4B:
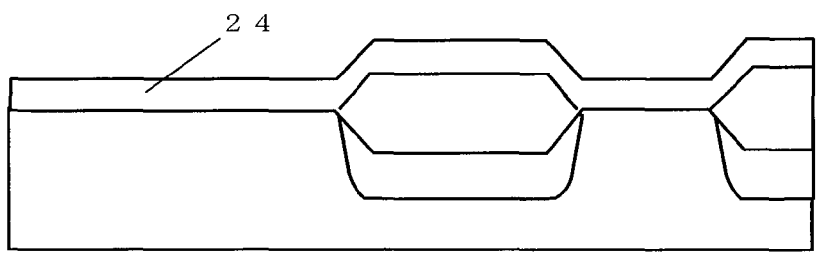
Figure 4C:
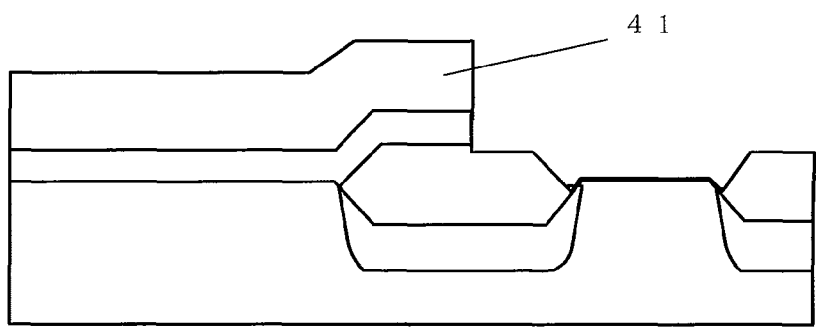
Figure 4D:
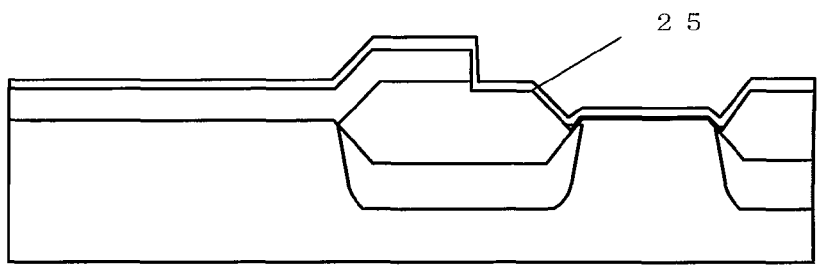
Figure 4E:
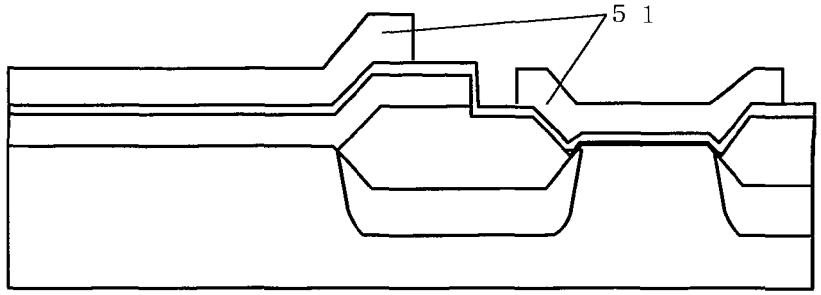

As illustrated in FIG. 3B, the gate electrode 51 of the MOS transistor having the relatively thin gate insulating film is set apart from the field insulating film 23 and the inversion-preventing diffusion layer 31 having relatively high concentration formed below the field insulating film 23. Accordingly, there is provided a stable structure which is not influenced by thickness fluctuation of the field insulating film 23, etching fluctuation of the first gate insulating film 24, and impurity concentration fluctuation at both sides of the channel due to the inversion-preventing diffusion layer 31, which are problems suffered by the conventional manufacturing method. Further, as illustrated in FIG. 3C, the high concentration diffusion layers 33 serving as the source and the drain are similarly set apart from the field insulating film 23 providing a structure in which the channel width and the width of the high concentration diffusion layer 33 are equal to each other.

As described above, according to the semiconductor device in which the MOS transistor having the relatively thick gate insulating film and the MOS transistor having the relatively thin gate insulating film are formed simultaneously, and the manufacturing method therefor, there may be provided a semiconductor device in which a narrow-channel effect of the MOS transistor having the relatively thin gate oxide film is suppressed and has a stable element characteristic, and a manufacturing method therefor.

In the present invention, the case where an N-channel type MOS transistor is used is described in detail by way of example, but the same effect may be observed even when a P-channel type MOS transistor is used. Further, a structure of a MOS transistor having a relatively thin gate insulating film is described by a simplest MOS transistor structure, but the same effect may be observed in a MOS transistor having, for example, a lightly doped drain (LDD) structure or a LOCOS offset structure.

What is claimed is:

1. A semiconductor device comprising:
   a first MOS transistor having a relatively thick gate insulating film in contact with a substrate surface; and
   a second MOS transistor in an active region having a relatively thin gate insulating film in contact with a channel region and a gate electrode in contact with the relatively thin gate insulating film, the relatively thick gate insulating film having a thickness greater than a thickness of the relatively thin gate insulating film,
   the channel region separating a source region and a drain region, the active region surrounded by a field insulating film, all of the source region and all of the drain region separated from a bird's beak region of the field insulating film by the relatively thick gate insulating film that covers an end region of the field insulating film in the active region of the second MOS transistor, the relatively thick gate insulating film completely surrounding the source region, the channel region, and the drain region, the gate electrode overlying the relatively thick gate insulating film at opposite sides of the gate electrode,
   the bird's beak region comprising a portion of the end region of the field insulating film extending along the active region toward the channel region.

2. A semiconductor device according to claim 1, wherein the first MOS transistor includes high concentration diffusion layers in the substrate surface serving as a source region and a drain region and a channel region, the source and drain regions separated from one another by the field insulating film and also separated from the channel region of the first MOS transistor by the field insulating film.

3. A semiconductor device comprising:
   a first MOS transistor having a relatively thick gate insulating film in contact with a substrate surface, wherein the relatively thick gate insulating film is in contact with a channel region of the first MOS transistor and a relatively thin gate insulating film is in contact with a drain region and a source region thereof, the relatively thick gate insulating film having a thickness greater than a thickness of the relatively thin gate insulating film; and
   a second MOS transistor in an active region surrounded by a field insulating film, the active region including the relatively thin gate insulating film in contact with a channel region, a drain region, and a source region thereof, the channel region separating the source region and the drain region, the second MOS transistor further including a gate electrode in contact with the relatively thin gate insulating film,
   wherein all of the source region and all of the drain region of the second MOS transistor are separated from a bird's beak region of the field insulating film by the relatively thick gate insulating film that covers an end region of the field insulating film in the active region of the second MOS transistor, the relatively thick gate insulating film completely surrounding the source region, the channel region, and the drain region, the gate electrode overlying the relatively thick gate insulating film at opposite sides of the gate electrode,
   the bird's beak region comprising a portion of the end region of the field insulating film extending along the active region toward the channel region.

4. A semiconductor device according to claim 1, wherein in the second MOS transistor, the gate electrode is spaced apart from the field insulating film and an inversion-preventing diffusion layer having relatively high concentration resides below the field insulating film.

* * * * *